United States Patent [11] 3,607,585

[72] Inventors Art E. Cassingham
Los Altos;
Arvin C. Skyrud, Milpitas, both of Calif.
[21] Appl. No. 779,846
[22] Filed Nov. 29, 1968
[45] Patented Sept. 21, 1971
[73] Assignee Sylvania Electric Products Inc.

[54] PRINTED CIRCUIT BOARD ARTWORK PAD
5 Claims, 9 Drawing Figs.

[52] U.S. Cl. .......... 161/6, 29/625, 96/36.2, 156/108, 156/252, 161/42, 161/113, 161/408
[51] Int. Cl. .......... B41m 3/08, B32b 3/10
[50] Field of Search .......... 161/6, 40, 42, 113, 408; 156/108, 252; 174/68.5; 96/36.2, 35; 29/625

[56] References Cited
UNITED STATES PATENTS

| | | | |
|---|---|---|---|
| 2,297,168 | 9/1942 | Rosenberg | 240/46.59 |
| 3,074,832 | 1/1963 | Graff | 156/108 X |
| 3,169,063 | 2/1965 | Johnston et al. | 96/36.2 X |
| 3,445,921 | 5/1969 | Leenhouts | 29/625 X |

*Primary Examiner*—John T. Goolkasian
*Assistant Examiner*—Joseph C. Gil
*Attorneys*—Norman J. O'Malley, Elmer J. Nealon and John F. Lawler

ABSTRACT: Artwork for printed circuit boards with plated-through holes is made with terminal area pads having center openings covered with an optical filter, preferably a colored strip. These pads permit photographic techniques to be used in making circuit pattern transparencies with and without pad center hole images and thus simplify this part of the process of making such printed circuit boards. The pads are formed by successively punching center openings in a continuous sheet of pad material, adhesively pressing a like sheet of filter material against the perforate sheet, cutting the pad shape in the double laminate, and removing the severed pads from the parent stock.

*INVENTORS*
ART E. CASSINGHAM
ARVIN C. SKYRUD

BY John L. Lawler
ATTORNEY

PATENTED SEP 21 1971 3,607,585

*INVENTORS*
ART E. CASSINGHAM
ARVIN C. SKYRUD

BY John L. Lawler
ATTORNEY

PRINTED CIRCUIT BOARD ARTWORK PAD

BACKGROUND OF THE INVENTION

This invention relates to printed circuit boards with plated-through holes, and more particularly to an improved printed circuit board artwork pad and method of making it.

During the process of making printed circuit boards with plated-through holes, the plastic board or laminate is drilled and thereafter is metallized to conductively coat the sides of the holes. The desired circuit patterns are then formed on opposite sides of the board in proper registry with the holes. In order to first locate the centers of the holes to be drilled, the circuit pattern is photographically transferred to the board using a transparency on which are formed images of the center openings in artwork pads. After the holes are drilled and metallized, the process is repeated to permanently form the circuit patterns on the board in precise alignment with the holes.

The technique regularly to insure precise alignment of the final patterns and the holes in the board is to expose the board through the same or duplicate transparency for both the hole drilling and final pattern forming steps. However, this technique requires that images of the pad holes on the transparency be removed or covered prior to exposure of the sensitized board in order to prevent light penetration into the holes and thus to insure that the sides of the holes in the finished board will be completely covered with conductive plating.

The practice in the past has been to cover the pad hole images on a positive transparency by manually dubbing each such image with an opaquing compound. Alternatively the hole images on the negative transparency may be manually removed by scraping. These operations are not only tedious, slow and costly but also tend to produce lower quality circuit boards as a result of human error in dubbing or scraping and as a result of cracking, chipping or flaking of the opaquing compound during subsequent photographic exposure. The amount of operator time required for such dubbing is directly proportional to the number, density and size of the pad center opening images to be covered; by way of example, the opaquing of one transparency having 250 hole images 0.02 inches in diameter in an area of 4 inches × 6 inches required approximately 30 minutes of operator time or one hour for a two-sided board.

A general object of the invention is the provision of a printed circuit artwork pad which simplifies the production of printed circuit boards with plated-through holes.

Another object of this invention is the provision of such a pad from which is photographically made circuit pattern transparencies with and without images of the pad center opening.

A further object is the provision of a simple method of mass-producing perforate pads with optical filters.

SUMMARY OF THE INVENTION

An artwork termination pad is formed with a center opening covered by an optical filter and enables rapid photographic reproduction of a master transparency with and without the image of the pad opening. Such pads are mass-produced by successively perforating a continuously moving pad sheet and thereafter adhering a preferably translucent optical filter sheet to the pad sheet and cutting filter pads to size from this double laminate structure.

DESCRIPTION OF PREFERRED EMBODIMENT

In order to better understand the invention, it is well to briefly review the prior art procedure followed in the making of printed circuit boards with plated-through holes by the widely used electroplating and etching process.

Figures 1, 2:
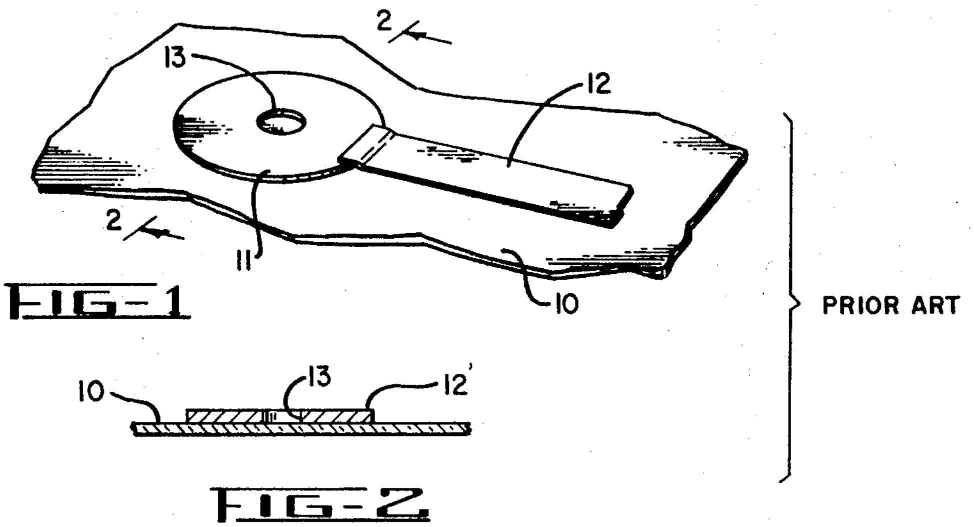
FIG. 1 is a perceptive view of a prior art tape and termination pad used in the layout of the artwork for printed circuit boards with plated-through holes.
FIG. 2 is a section taken on line 2—2 of FIG. 1.

One of the initial steps in the process of making printed circuit boards with plated-through holes is the construction of the artwork. This includes layout of the circuit pattern on a preferably transparent art sheet 10, see FIGS. 1 and 2, with pressure sensitive tape for conductor lines and pads corresponding to the conductor termination areas. While a single-artwork sheet typically may have over 100 pads and separate lengths of tape, only one such pad 11 and tape 12 are shown in the drawings for the sake of simplicity and clarity of the description. The scale of the circuit pattern made on the art sheet 10 in this manner is generally enlarged compared to the size of the circuit pattern to be ultimately deposited on the circuit board, the art work pattern being reproduced photographically to the desired size as is well known in the art. In the preparation of art sheets for printed circuit boards with plated-through holes, pads 11 having center openings 13 are used to locate the position of the holes in the board with respect to the circuits formed on them.

After the desired circuit pattern has been laid out on the art sheet, a master photographic transparency, either a negative or a positive or both, is made by photographically transferring and reducing the pattern on the art sheet. The surface of a copper-clad plastic board or laminate is photosensitized with a photoresist and then is photographically exposed through this master transparency. A temporary circuit pattern is formed on the board by the developed photoresist, the centers of the holes to be drilled being located by the developed images of the center hole 13 of each pad. After the holes are drilled in the board, the latter is plated with a thin layer of copper in order to metallize the sides of the holes and to provide a base for later plating of the holes.

The board is next photosensitized with a photoresist coating and is again exposed through the same or duplicate transparency in proper registry with the drilled holes. The photoresist invariably coats at least part of the copper plate on the sides of the holes and as a consequence steps must be taken to remove or block the hole center images on the transparency to insure optical isolation of the drilled holes from deleterious effects of light. Thus, if the transparency is a positive and the photoresist is a resist to plating rather than a resist to etching, light penetration of the drilled hole causes the photoresist to polymerize and harden and, if allowed to remain, to ultimately cause voids or like discontinuities in the final plating on the sides of the holes. It is extremely difficult if not impossible to remove hardened photoresist from the drilled holes, short of redrilling them. Therefore, in order to prevent such light penetration, the pad hole images on the positive transparency, according to conventional practice, are manually dubbed with an opaquing substance so that the image of each pad is completely opaque. The board is then exposed through the dubbed master, the desired circuit pattern is plated with an etch-resistant metal and the resist is stripped to complete one side of the board. A desired circuit pattern may be similarly formed on the opposite side in alignment with the drilled holes to make a double-sided board.

Figure 5:
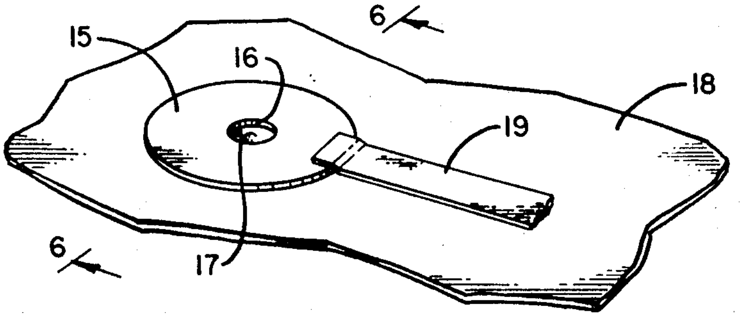
FIG. 5 is a view similar to FIG. 1 with the pad of FIGS. 3 and 4.
Figure 6:
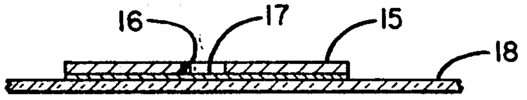
FIG. 6 is a section taken on line 6—6 of FIG. 5.
Figure 3:
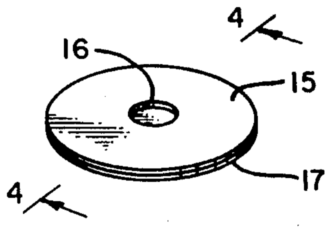
FIG. 3 is a perspective view of a termination pad embodying the invention.
Figure 4:
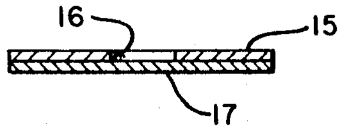
FIG. 4 is a section taken on line 4—4 of FIG. 3.

The disadvantages of opaquing the positive transparency are eliminated, in accordance with the invention, with a pad 15, see FIGS. 3 and 4, having a center opening 16 covered by an optical filter 17 in the form of a colored transparent disk having the same dimensions as and adhesively secured to one surface of the pad. Art sheet 18 is laid out with such pads 15 and tape 19, see FIG. 5 and 6, in the same manner as described above in the prior art and the completed artwork is used, inter alia, to make two positive transparencies, one with and the other without pad center hole images as described in detail in our copending application Ser. No 779,845 filed Nov. 29, 1968. The transparency with center hole images is used to expose the photosensitized copper-clad board for locating centers of the holes to be drilled. The other transparency is used to photographically transfer the circuit pattern to the drilled board in precise registration with the holes in it.

Figure 7:
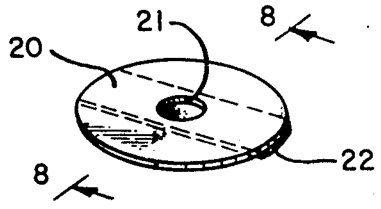
FIG. 7 is a perspective view of a modified form of pad embodying the invention.
Figure 8:
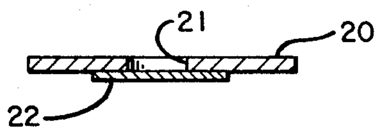
FIG. 8 is a section taken on line 8—8 of FIG. 7.

Another form of the pad construction is shown in FIGS. 7 and 8 as pad 20 having a center opening 21 covered by a translucent color filter 22 having a length equal to the diameter of the pad and a width slightly greater than the diameter of opening 21.

Figure 9:
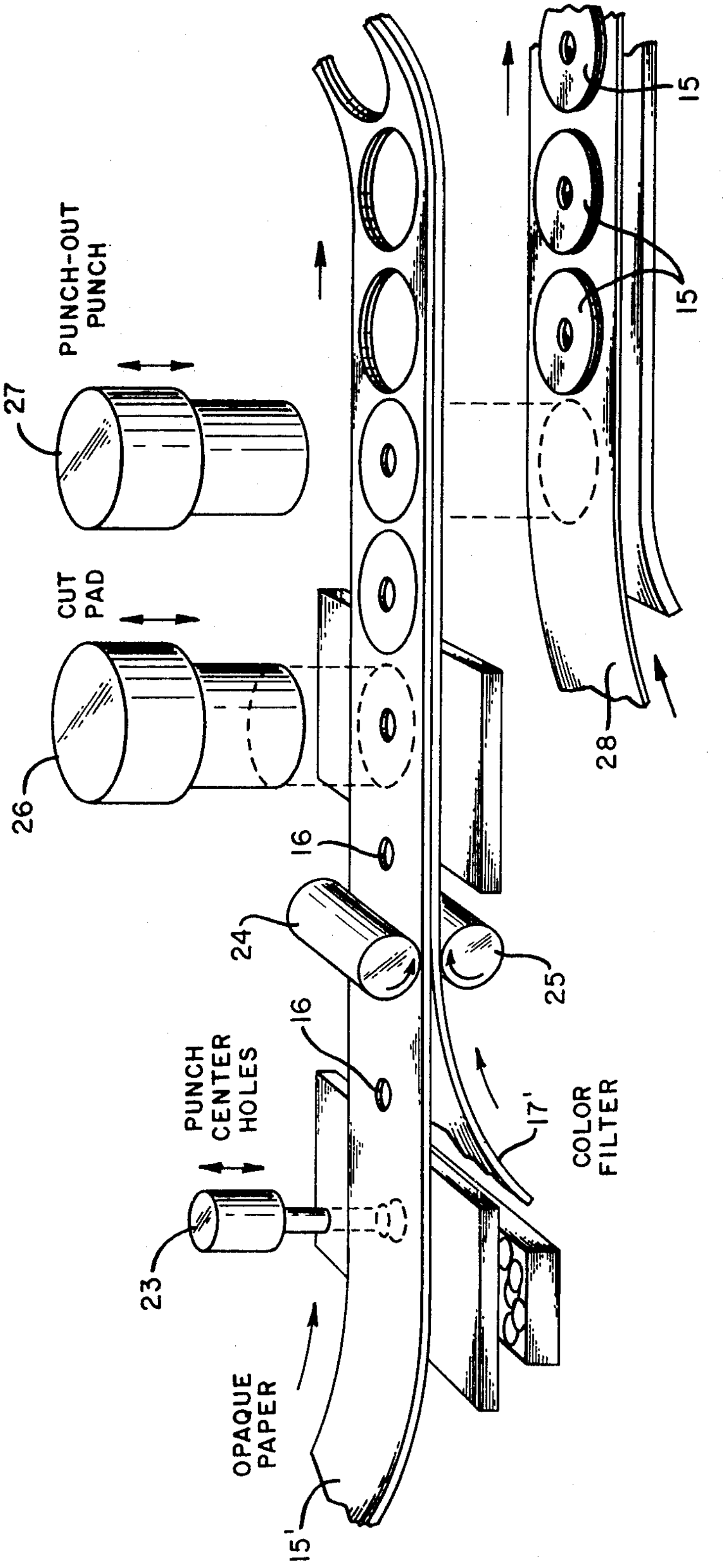
FIG. 9 is a partially schematic perspective view of apparatus for mass-producing pads with filters in accordance with the invention.

The apparatus for making pads 15 with filters 17 is illustrated in FIG. 9. Opaque pad material 15′ from a supply roll is moved continuously under a reciprocating punch 23 which forms holes 16 therein at longitudinally spaced intervals. A continuous sheet of optical filter material 17′ is then pressed by rolls 24 and 25 against and adhesively secured to one side of the perforated pad sheet 15′ and the double laminate stock is then fed to a transversely reciprocating tubular cutter 26 which successively cuts each circular pad 15 and disk 17 concentrically of opening 16. Thereafter a punch 17 pushes the severed filter pads from the double sheet stock to a transfer strip 28 to which the finished filter pads lightly adhere. Strip 28 is thereafter formed into rolls or is cut to suitable lengths for packaging an ultimate use in making art sheets. Alternatively, filter sheet 17′ may have a width slightly greater than the diameter of each pad opening 16 and substantially less than the pad diameter as long as it covers each opening when applied to the pad sheet. Filter pad 20 is made in this manner.

What is claimed is:

1. In an art sheet circuit pattern employed in photographically making printed circuit boards with plated-through holes, the improvement of an optically opaque circuit terminal pad mounted on said sheet, said pad having a center hole therein and an optical filter covering said hole.

2. The pad according to claim 1 in which said filter is translucent and colored.

3. The pad according to claim 1 in which said filter and said piece have the same external dimensions.

4. A printed circuit board artwork pad having an opening therein and an optical filter covering said opening.

5. The pad according to claim 4 in which said filter is translucent and colored.